United States Patent [19]

Colombo

[11] Patent Number: 4,582,683

[45] Date of Patent: Apr. 15, 1986

[54] (HG,CD,ZN)TE CRYSTAL COMPOSITIONS

[75] Inventor: Luigi Colombo, Richardson, Tex.

[73] Assignee: Texas Instruments Incorporated, Dallas, Tex.

[21] Appl. No.: 677,765

[22] Filed: Dec. 3, 1984

[51] Int. Cl.$^4$ .................... C22C 1/02; C22C 7/00; C22C 18/00; C22C 20/00

[52] U.S. Cl. .................................. 420/525; 420/526; 420/523

[58] Field of Search ................ 420/525, 526, 523

[56] References Cited

U.S. PATENT DOCUMENTS

| | | | |
|---|---|---|---|
| 2,953,690 | 9/1960 | Lawson et al. | 420/526 |
| 3,468,363 | 9/1969 | Parker et al. | 420/526 |
| 3,656,944 | 4/1972 | Bran | 420/526 |
| 3,723,190 | 3/1973 | Kruse et al. | 420/526 |
| 3,849,205 | 11/1974 | Bran et al. | 420/526 |
| 4,003,741 | 1/1977 | Gallet et al. | 420/525 |
| 4,011,074 | 3/1977 | Dietl et al. | 420/526 |
| 4,086,106 | 4/1978 | Johnson et al. | 420/526 |
| 4,447,393 | 5/1984 | Weirauch | 420/525 |
| 4,462,959 | 7/1984 | Tregilgas | 420/525 |

Primary Examiner—Veronica O'Keefe
Attorney, Agent, or Firm—Alva H. Bandy; Leo N. Heiting; Melvin Sharp

[57] ABSTRACT

An alloy for use in production of electromagnetic radiation detectors comprises (Hg,Cd,Zn,)Te for producing crystals with dislocation densities less than about $10^4$ cm$^{-2}$. The elements are combined in accordance with the formula $(Hg_{1-x-y}Cd_xZn_y)Te$ where x is about 10 to about 90 and y is about 0.6 to about 5.0 mole percent.

3 Claims, 6 Drawing Figures

(HG,CD,ZN)TE CRYSTAL COMPOSITIONS

This invention relates to alloys and more particularly to a (Hg, Cd, Zn)Te alloy for use in the production of electromagnetic radiation detectors.

In the past alloys of mercury, cadmium and tellurium manufactured using the solid state recrystalline (SSR) method have been useful materials for photoconductor type infrared destectors. Attempts to expand the use of mercury, cadmium and tellurium to metal insulator semiconductor (MIS) and other depletion devices have had limited success. The problem is that photoconductive devices are surface devices, while the MIS is a depletion device. The operation of photoconductive devices is less affected by crystalline defects such as point defects and line defects than are the devices based on depletion regions. The solution of the problem lies in the reduction of these defects in the crystalline structure of mercury, cadmium and tellurium.

Accordingly, it is an object of this invention to provide a semiconductor alloy suitable for devicers based on depletion regions.

Another object of this invention is to provide an alloy having minimum lattice strain.

Still another object of the invention is to provide an alloy having improved mechanical properties to decrease damage during processing and crystal growth.

Briefly stated, the invention comprises adding zinc to the mercury, cadmium, tellurium alloy produced by the solid-state recrystallization method.

A better understanding of the invention will be derived by reference to the ensuing specification and the accompanying drawings in which.

Although the invention will be described in relation to a preferred embodiment of producing a mercury cadmium zinc tellurium alloy, it is intended that the invention be limited only as defined in the appended claims.

Figure 1:
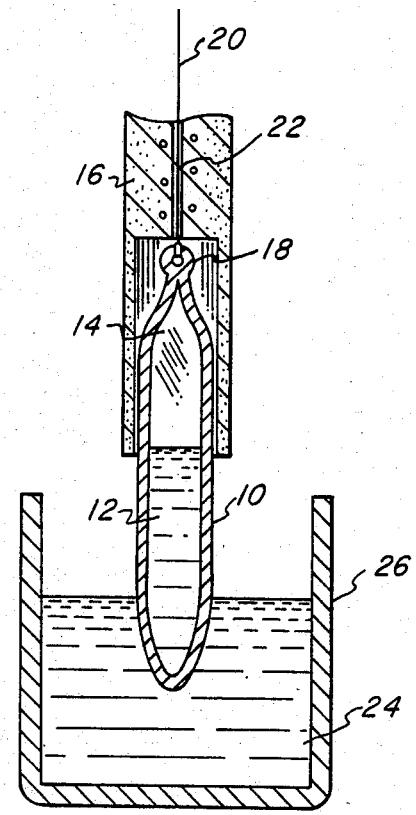
FIG. 1 is a view partly in cross section of an ampoule and contents being quenched.

Referring to FIG. 1, an ampoule 10 is partially filled with alloy 12 and has a vapor space 14 surrounded and thermally insulated by a fire brick or other suitable insulator 16. The ampoule and contents are heated in a conventional electrically powered resistance-heated rocking furnace (not shown). An eyelet 18 has connected thereto a wire 20 extending through a channel 22 in the insulator 16. After the ampoule, its contents and the insulator have been heated at a temperature sufficient to maintain the alloy in a liquid state for the desired amount of time, the ampoule 10 and the insulator 16 are together removed from the rocking furnace and immediately thereafter quenched. In the preferred embodiment, at least a portion of the ampoule 10 containing the alloy 12 is immersed in the bath 24. The quenching bath 24 can be any suitable quenching liquid; or alternatively inert gases such as, for example, nitrogen may be used for quenching.

In practice the ampoule 10 (FIG. 1) is first washed and then etched in a conventional manner by rinsing the ampoule with an etch solution. After being so treated, the ampoule is rinsed with deionized water followed by distilled water. The ampoule is then vacuum fired and placed in a glove box containing a nitrogen atmosphere. In the glove box, the ampoule is loaded in accordance with a formula as follows:

$(Hg_{1-x-y}Cd_xZn_y)Te$ where x is from about 0.90 to about 0.10 moles and y is from about 0.6 to about 5.0 mole percent.

Figure 2:
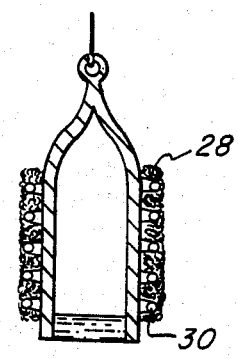
FIG. 2 is a view partly in cross section showing an alternative embodiment to that of FIG. 1.

The function of the insulator 16 is to retain heat in the vapor space 14 to prevent rapid cooling of the vapor therein. Thus, in the case of the alloy mercury cadmium zinc tellulrium, the vapor pressure of mercury is maintained at a relatively high level while cooling the molten alloy. So maintaining the vapor pressure in the vapor space 14 prevents flashing of mercury from within the molten alloy body while the latter is cooling. This prevents the production of blow holes and prevents piping of pitting in the solidified alloy ingot. Additionally, as shown in FIG. 2, an auxiliary electric resistance heater 28 insulated by a layer 30 of quartz wool can be positioned about the vapor space to maintain a higher temperature and thus a higher vapor pressure in the vapor space.

For a more detailed description of the solid state recrystallization method those skilled in the art are referred to U.S. Pat. No. 3,656,944 issued Apr. 18, 1972 to Maurice J. Brau, assignor to Texas Instruments Incorporated, for a "METHOD OF PRODUCING HOMOGENEIOUS INGOTS OF A METALLIC ALLOY".

Figure 3:
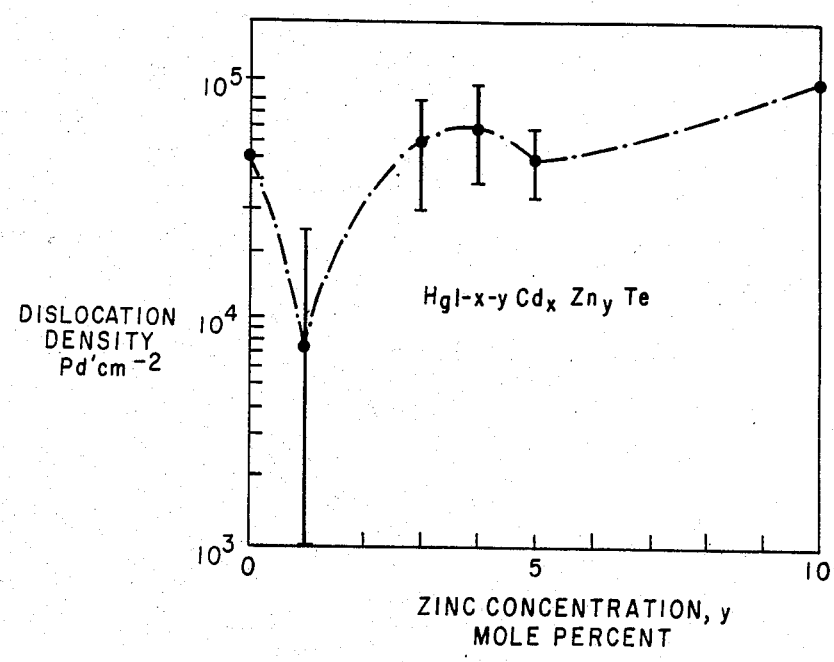
FIG. 3 is a chart of the dislocation density as a function of the Zn concentration y.

EXAMPLES $Hg_{1-x-y}(Cd_xZn_y)Te$ were grown with zinc concentrations ranging from y=0 to 11.3 mole percent for x=11.2 to 22.5 mole percent. The alloy was heated to a temperature (860 degrees C.) above liquidus and annealed under mercury vapor pressure at a temperature (665 degrees C.) just below the solidus. It was found that the dislocation density was decreased by as much as a factor of 40 with respect to that of $Hg_{0.775}Cd_{0.225}Te$. FIG. 3 shows the dislocation density as a function of Zn concentration with each point representing at least four ingots.

Figure 4:
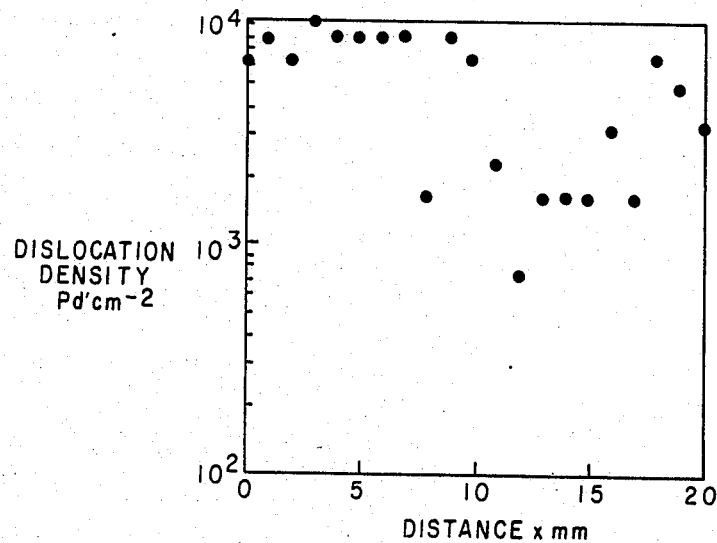
FIG. 4 is a chart of the dislocation density as a function of position along a $Hg_{0.775}Cd_{0.215}Zn_{0.01}Te$ wafer.
Figure 6:
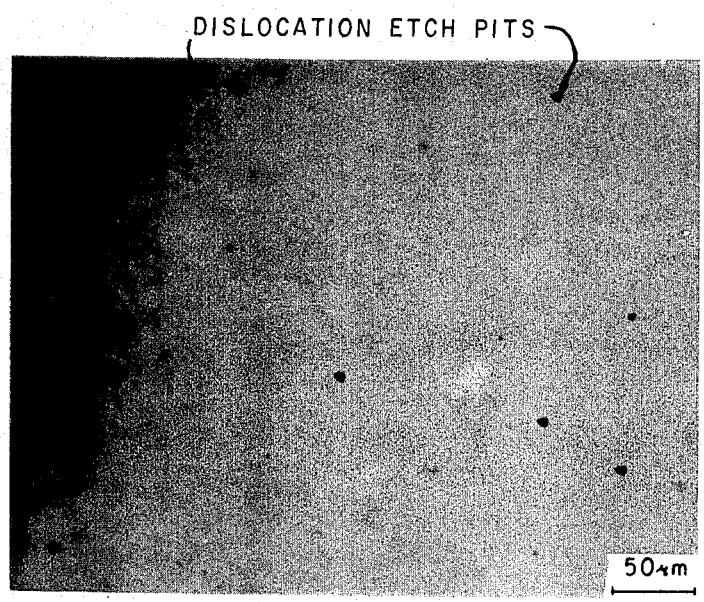
FIG. 6 is a chart of the infrared transmission of n-type (Hg,Cd,Zn)Te as a function of Zn concentration.

In crystals with Zn concentrations of about 1 mole percent and a Hg and Cd concentration of 77.5 mole percent and 21.5 mole percent, respectively, the dislocation dinsity decreased to a level lower than $10^4$ cm$^{-2}$. The Cd-to-Zn ratio for dendritic lattice match was inferred from the composition profile of the dendrites. FIG. 4 further shows the dislocation density along a $Hg_{0.775}Cd_{0.215}Zn_{0.01}Te$ wafer. The dislocation density is uniformly below $10^4$ cm$^{-2}$ and as low as $7.5 \times 10^2$ cm$^{-2}$, and FIG. 6 shows the dislocation structure of (Hg,Cd,Zn)Te on the (111)A face. (Hg,Cd)Te crystals grown under the same thermodynamic conditions have dislocation densities in the range $3 \times 10^4$ to $10^5$ cm$^{-2}$. The dislocation density reduction is attributable to a reduction of the lattice mismatch between dendrites and regions of compositional variation even after grain growth and to an increase of the elastic modulus owing to a hardening effect by the Zn atoms.

Figure 5:
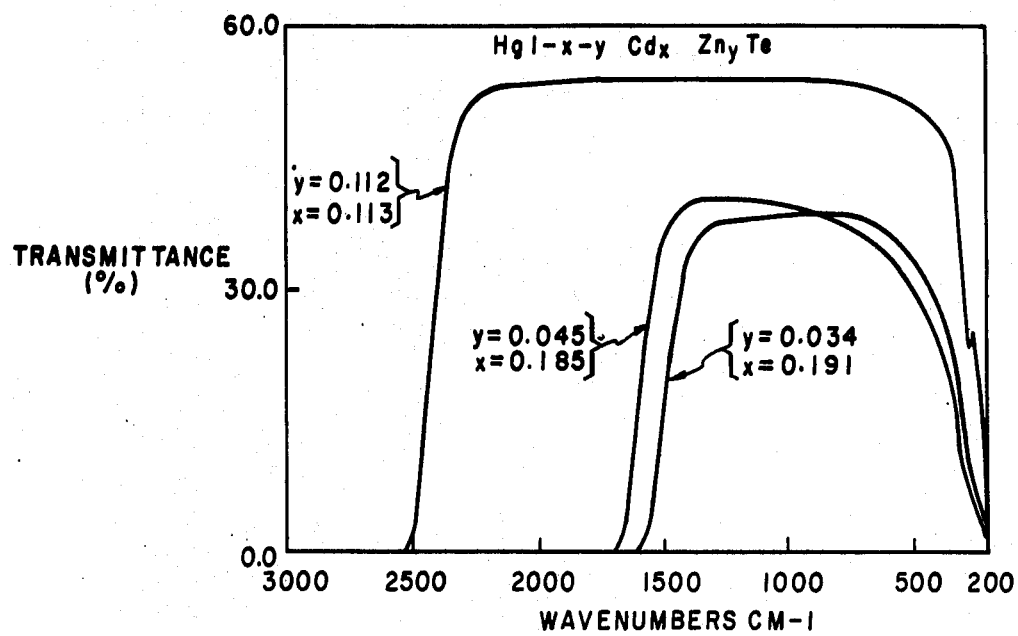
FIG. 5 is a micrograph of $Hg_{0.775}Cd_{0.215}Zn_{0.01}Te$ showing dislocation etch pits on the (111)A face.

FIG. 5 shows the infrared transmission spectra of n-type (Hg,Cd,Zn)Te crystals, with varying Zn-toCd ratio for a constant Hg concentration. The band gap was determined at 294K. from the transmission curves at an absorption coefficient alpha=200 cm$^{-1}$. The band gap, $E_g$, is found to increase with increasing Zn concentration in qualitative agreement with the calculated values; however, some bowing is observed. Table 1 summarizes the transport properties, as measured using the Hall effect, and the band gap measured from the infrared spectra at 294K and MIS device spectral cutoff wavelength at 77K. The carrier concentration and mobility of (Hg,Cd,Zn)Te are comparable to those of (Hg,Cd)Te.

TABLE 1

ELECTRICAL CHARACTERISTICS OF (HG, CD, ZN)TE WITH VARYING ZINC CONCENTRATION

| No. | $(N_D-N_A)$ 77K cm$^{-3}$ | Mu77K cm/V·s | $(N_D-N_A)$ 294K cm$^{-3}$ | LAMBDA$_{CO}$ (77K,MIS) MICRO M. | $E_g$ (294K) eV | [Zn] | [Cd] |
|---|---|---|---|---|---|---|---|
| 1 | $6 \times 10^{14}$ | $4 \times 10^4$ | $2.5 \times 10^{15}$ | — | 0.314 | 0.113 | 0.112 |
| 2 | $5.6 \times 10^{14}$ | $8.6 \times 10^4$ | $8.2 \times 10^{15}$ | 8.4 | — | 0.05 | 0.175 |
| 3 | $1.1 \times 10^{14}$ | $9 \times 10^4$ | $9.4 \times 10^{15}$ | — | 0.211 | 0.045 | 0.180 |
| 4 | $1.6 \times 10^{14}$ | $1 \times 10^5$ | $1.9 \times 10^{16}$ | — | 0.198 | 0.034 | 0.191 |
| 5 | $5.4 \times 10^{14}$ | $1.69 \times 10^5$ | $2.0 \times 10^{16}$ | — | 0.189 | 0.01 | 0.215 |
| 6 | $3.3 \times 10^{14}$ | $1.35 \times 10^5$ | $1.7 \times 10^{16}$ | 9.6 | — | 0.01 | 0.215 |

Although the present invention has been described in conjunction with preferred embodiments, it is to be understood that modifications and variations may be resorted to without departing from the scope of the invention, as those skilled in the art will readily understand.

What is claimed is:

1. An alloy for use in production of electromagmetic radiation detectors consisting essentially of:
    (Hg,Cd,Zn)Te in accordance with the formula:
    $(Hg_{1-x-y}Cd_xZn_y)Te$, where x is 10 to 90 mole percent and y is 0.6 to 5.0 mole percent.

2. An alloy according to claim 1 wherein the Hg is from 10 to 90 mole percent.

3. An alloy for use in production of electromagnetic radiation detectors consisting essentially of:

$Hg_{0.784}Cd_{0.2045}Zn_{0.0115}Te$.

* * * * *